US012635081B1

(12) United States Patent
Wang et al.

(10) Patent No.: US 12,635,081 B1
(45) Date of Patent: May 19, 2026

(54) WARPAGE-RESILIENT ATTACHMENT OF DIE TO SUBSTRATE IN MASS REFLOW SOLDERING

(71) Applicant: Marvell Asia Pte Ltd, Singapore (SG)

(72) Inventors: Hsiu-Che Wang, Oak Park, CA (US); Dwayne R Shirley, Valley Glen, CA (US); Roberto Coccioli, Simi Valley, CA (US); Pushkraj Tumne, Agoura Hills, CA (US)

(73) Assignee: Marvell Asia Pte Ltd, Singapore (SG)

( * ) Notice: Subject to any disclaimer, the term of this patent is extended or adjusted under 35 U.S.C. 154(b) by 438 days.

(21) Appl. No.: 18/446,511

(22) Filed: Aug. 9, 2023

Related U.S. Application Data

(60) Provisional application No. 63/398,567, filed on Aug. 17, 2022.

(51) Int. Cl.
| | |
|---|---|
| *H05K 3/34* | (2026.01) |
| *H05K 3/3478* | (2026.01) |
| *H05K 3/3494* | (2026.01) |

(52) U.S. Cl.
CPC ......... *H05K 3/3494* (2013.01); *H05K 3/3478* (2013.01)

(58) Field of Classification Search
CPC .......................... H05K 3/3494; H05K 3/3478
See application file for complete search history.

(56) References Cited

U.S. PATENT DOCUMENTS

| | | | |
|---|---|---|---|
| 5,969,947 A | 10/1999 | Johnson et al. | |
| 5,970,319 A * | 10/1999 | Banks ................. | H01L 23/3733 |
| | | | 257/E21.503 |
| 6,775,140 B2 * | 8/2004 | Shim ................... | H01L 23/3128 |
| | | | 257/E23.101 |
| 2002/0039807 A1 | 4/2002 | Koyama | |
| 2002/0068417 A1 * | 6/2002 | Farnworth ............. | H05K 3/303 |
| | | | 438/455 |
| 2005/0227411 A1 * | 10/2005 | Grigg ...................... | H01L 24/11 |
| | | | 438/106 |
| 2009/0057920 A1 | 3/2009 | Dedic et al. | |
| 2016/0351549 A1 * | 12/2016 | Lin ......................... | H01L 25/50 |
| 2019/0390926 A1 | 12/2019 | Koyano et al. | |
| 2020/0051894 A1 | 2/2020 | Wan et al. | |
| 2023/0060577 A1 * | 3/2023 | Akai ...................... | H01R 12/52 |
| 2023/0063270 A1 | 3/2023 | Lee et al. | |

FOREIGN PATENT DOCUMENTS

JP          2010182855 A          8/2010

OTHER PUBLICATIONS

Marvell, "Colorz® 100G DWDM Optical Platform for Data Center Interconnects," Product Brief, pp. 1-1, year 2021.
Dow Corning, "Semiconductor Packaging Materials Selection Guide," pp. 1-8, year 2016.

(Continued)

*Primary Examiner* — S M Sohel Imtiaz
(74) *Attorney, Agent, or Firm* — Meitar Patents LTD.; Daniel Kligler

(57) ABSTRACT

A method for fabricating electronic devices includes applying an array of non-uniformly sized spots of solder material on a substrate. An average size of the spots is larger in a center portion of the array than in a peripheral portion of the array. A die is soldered to the substrate using the array.

19 Claims, 4 Drawing Sheets

(56) References Cited

OTHER PUBLICATIONS

Dow Corning, "Dow Corning® SE 4450 Thermally Conductive Adhesive," Product Information, pp. 1-3, year 2008.

Graf et al., U.S. Appl. No. 18/190,163, filed Mar. 27, 2023.

Patel et al., U.S. Appl. No. 18/177,136, filed Mar. 2, 2023.

Bond et al., U.S. Appl. No. 18/301,306, filed Apr. 17, 2023.

Ajinomoto Co., Inc., "Ajinomoto Build-up Film," pp. 1-17, years 2019-2023.

ShinEtsu Microsi, "Thermal Interface Material X23-7772-4," Technical Data Sheet, pp. 1-2, year 2011, as downloaded from https://j6i3r2y3.stackpathcdn.com/wp-content/uploads/2015/06/DS-20X-23-7772-4.pdf.

Henkel Corporation, "Loctite Ablestik 965-1L," Technical Data Sheet, pp. 1-2, Oct. 2014.

Pan et al., "Comparing Techniques for Temperature-Dependent Warpage Measurement," Global SMT & Packaging, pp. 14-18, Feb. 2008.

Cooler Master Technology Inc., "MasterGel Pro V2 High Thermal Conductivity Compound," p. 1, Apr. 9, 2020, as downloaded from https://www.coolermaster.com/catalog/coolers/thermal-grease/mastergel-pro-v2/.

Mathweb, "Master Bond EP5TC-80 One component thermally conductive, electrically insulating epoxy", pp. 1-2, years 1996-2023, as downloaded from https://www.matweb.com/search/datasheet.aspx?matguid=f13765d1206f4ef0b57875be71583e23&ckck=1.

Mathweb, "Master Bond EP3HTS-TC One component, silver filled epoxy", pp. 1-2, years 1996-2023, as downloaded from https://www.matweb.com/search/datasheet.aspx?matguid=dc973bc6e7344138a23423672ea632d8.

Patel et al., U.S. Appl. No. 18/343,769, filed Jun. 29, 2023.

* cited by examiner

| APPLY ARRAY OF NON-UNIFORMLY SIZED SPOTS OF SOLDER MATERIAL ON SUBSTRATE, SPOTS LARGER IN CENTER AND SMALLER IN PERIPHERY OF ARRAY | ~84 |

| SOLDER INTERPOSER TO SUBSTRATE USING REFLOW | ~88 |

WARPAGE-RESILIENT ATTACHMENT OF DIE TO SUBSTRATE IN MASS REFLOW SOLDERING

CROSS-REFERENCE TO RELATED APPLICATIONS

This application claims the benefit of U.S. Provisional Patent Application 63/398,567, filed Aug. 17, 2022, whose disclosure is incorporated herein by reference.

FIELD OF THE DISCLOSURE

The present disclosure relates generally to fabrication of electronic devices, and particularly to techniques for warpage-resilient attachment of dies to substrates.

BACKGROUND

Various electronic devices, for example Multi-Chip Modules (MCMs), are manufactured using mass reflow soldering processes. One of the challenges of mass reflow soldering is possible warpage of dies or interposers due to the high temperatures and material properties involved.

The description above is presented as a general overview of related art in this field and should not be construed as an admission that any of the information it contains constitutes prior art against the present patent application.

SUMMARY

An embodiment that is described herein provides a method for fabricating electronic devices. The method includes applying an array of non-uniformly sized spots of solder material on a substrate. An average size of the spots is larger in a center portion of the array than in a peripheral portion of the array. A die is soldered to the substrate using the array.

In some embodiments, soldering the die includes soldering an interposer. In an embodiment, applying the array includes disposing the solder material on the substrate via a stencil having an array of non-uniformly sized openings, an average size of the openings being larger in a center portion of the stencil than in a peripheral portion of the stencil.

In a disclosed embodiment, applying the array includes disposing the spots onto corresponding pads on the substrate, an average size of the pads facing the center portion of the array being larger than an average size of the pads facing the peripheral portion of the array. Alternatively, applying the array includes disposing the spots onto corresponding pads on the substrate, an average size of the pads facing the center portion of the array being equal to an average size of the pads facing the peripheral portion of the array.

In some embodiments, soldering the die to the substrate includes soldering the die using a reflow soldering process. In some embodiments, soldering the die to the substrate includes placing a stiffener over the die, and performing the reflow soldering process while the stiffener is in contact with the die. In an embodiment, placing the stiffener over the die includes bonding the stiffener to the die using a bonding material. In an embodiment, placing the stiffener over the die includes temporarily fixing the stiffener over the die using a mechanical fixture. In some embodiments, the method further includes removing the stiffener from the die following the reflow process. In alternative embodiments, the method further includes retaining the stiffener on the die following the reflow process, for use as a heatsink.

There is additionally provided, in accordance with an embodiment that is described herein, a method for fabricating electronic devices. The method includes applying an array of spots of solder material on a substrate. A die is placed over the array of spots. A stiffener is placed over the die. The die is soldered to the substrate using the array of spots, by a reflow soldering process, while the stiffener is in contact with the die.

In some embodiments, placing the stiffener over the die includes bonding the stiffener to the die using a bonding material. In other embodiments, placing the stiffener over the die includes temporarily fixing the stiffener over the die using a mechanical fixture.

There is further provided, in accordance with an embodiment that is described herein, an electronic device including a substrate and a die. The substrate has an array of non-uniformly sized spots of solder material applied thereon. An average size of the spots is larger in a center portion of the array than in a peripheral portion of the array. The die is soldered to the substrate using the array.

The present disclosure will be more fully understood from the following detailed description of the embodiments thereof, taken together with the drawings in which:

BRIEF DESCRIPTION OF THE DRAWINGS

FIG. 1 is a schematic cross section of a Multi-Chip Module (MCM), showing effects of warpage that are mitigated in accordance with embodiments described herein;

FIGS. 2A and 2B are diagrams that schematically illustrate formation of non-uniformly sized spots of solder material for warpage-resilient soldering, in accordance with embodiments that are described herein;

DETAILED DESCRIPTION OF EMBODIMENTS

Figure 3:
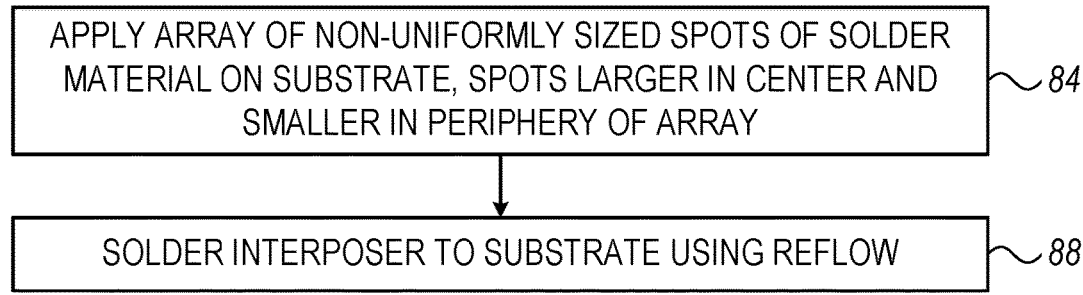
FIG. 3 is a flow chart that schematically illustrates a method for warpage-resilient soldering using non-uniformly sized spots of solder material, in accordance with an embodiment that is described herein.

When soldering a die to a substrate using a mass reflow soldering process (referred to herein simply as "reflow" for brevity), the high temperature of the reflow process may cause the die to deform ("warp"). Warpage is especially severe when the die comprises a stack of multiple layers that differ in Coefficient of Thermal Expansion (CTE). Warpage may cause cold joints between the die and the substrate, and/or cause misalignment between the die and neighboring structures on the substrate or on top of the die.

One possible way to reduce the warpage is to apply thermal-compression bonding to the die during reflow. This solution, however, reduces the throughout of the reflow process significantly, and also requires special equipment and tooling. The resulting manufacturing process is therefore slow and expensive.

Embodiments that are described herein provide improved techniques for attaching dies to substrates using reflow, in a manner that is resilient to warpage. The disclosed embodiments are described mainly in the context of an interposer, but the disclosed techniques can be used with any other suitable type of die.

In some embodiments, a die is soldered to a substrate by (i) forming on the substrate an array of non-uniformly sized spots of soldering material ("solder bumps") and then (ii) soldering the die to the substrate using reflow. The solder bumps in a central portion of the array are, on average, larger than the solder bumps in a peripheral portion of the array. The rationale behind this technique is that, in many practical cases, warpage tends to be larger in the center of the die, and therefore a larger quantity of soldering material is needed in these locations.

In an embodiment, the array of solder bumps is deposited on the substrate using a stencil having non-uniformly sized openings. In some embodiments, the corresponding pads on the substrate are also non-uniformly sized, so that larger solder bumps are formed on larger pads and vice versa. In alternative embodiments the pads on the substrate are uniform in size, even though the solder bumps are not.

In other embodiments, a rigid stiffener is placed over the die while the die and the substrate undergo the reflow soldering process. In some of these embodiments the stiffener is attached to the die using bonding material. In other embodiments the stiffener is held in place using a mechanical fixture. In some embodiments the stiffener is removed from the die following the reflow. In alternative embodiments, the stiffener remains attached to the die and also serves as a heatsink. In the latter embodiments, thermal vias may be formed through the stiffener to improve heat conduction from the die.

The disclosed techniques are highly effective in minimizing warpage of interposers and other dies in mass reflow processes. At the same time, the disclosed techniques lend themselves to straightforward integration with conventional reflow processes and equipment. As such, the disclosed techniques minimize warpage with little or no degradation in reflow throughput, and little or no increase in production cost.

Figure 1:
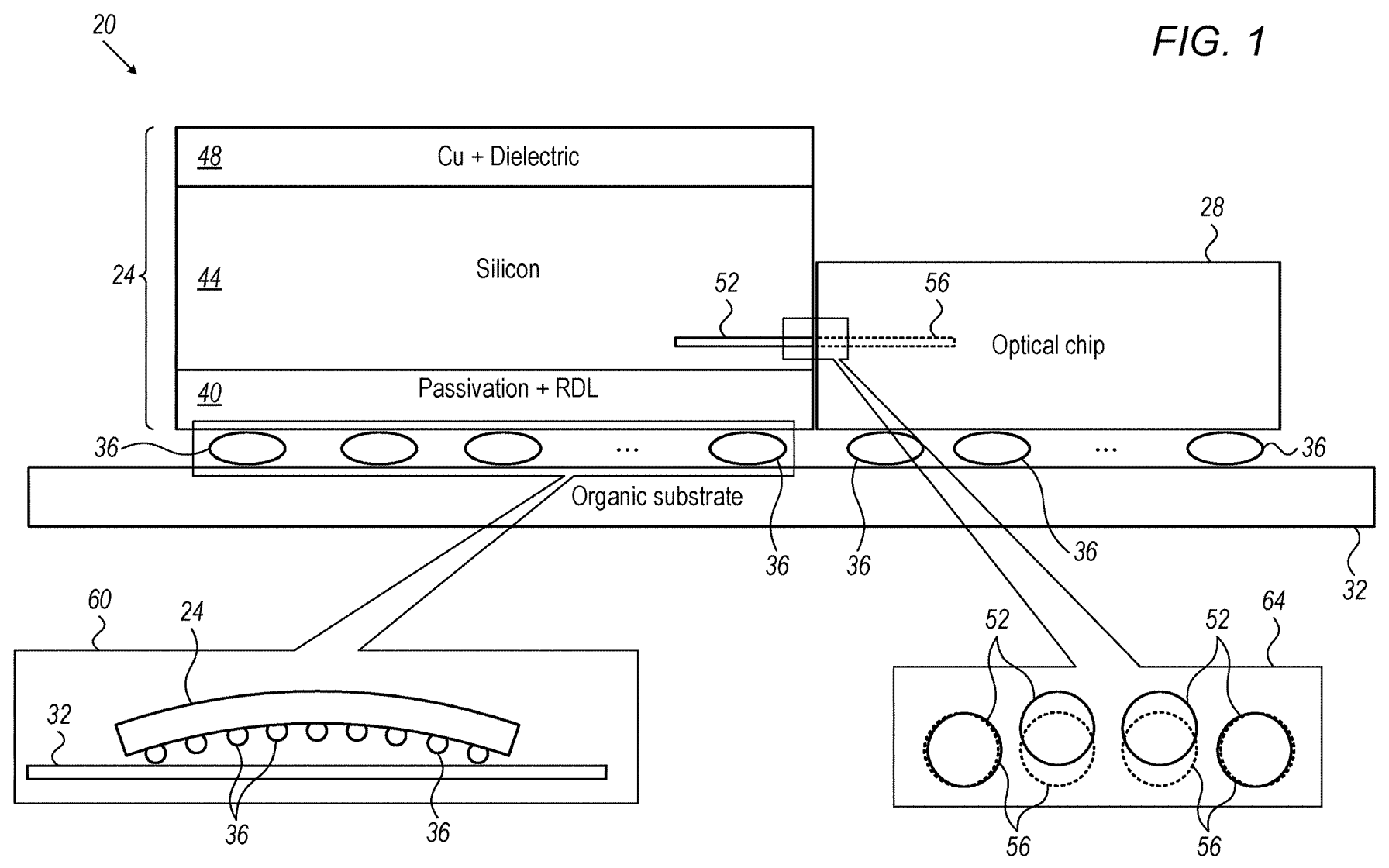

FIG. 1 is a schematic cross section of a Multi-Chip Module (MCM) 20, showing effects of warpage that are mitigated in accordance with embodiments described herein. In the present example, MCM 20 comprises a silicon interposer 24 and an optical chip 28, both being mounted on an organic substrate 32 using a plurality of solder bumps 36. Solder bumps 36 provide both mechanical attachment and electrical connections.

In the embodiment depicted in FIG. 1, interposer 24 comprises a stack of multiple layers including (i) a passivation and redistribution layer (RDL) 40, (ii) a silicon layer 44, and (iii) a stack 48 of copper layers and dielectric layers. Interposer 24 may carry any suitable types of electronic and/or photonic devices, coupled to layers 40 and/or to layers 48. Optical chip 28 may comprise, for example, a Planar Lightwave Circuit (PLC) chip or an optical fiber array. Organic substrate 32 may be fabricated from various materials, such as prepreg or Ajinomoto Build-up Film (ABF).

In some embodiments, one or more optical signals are transferred between interposer 24 and optical chip 28. For transferring the optical signals, one or more optical waveguides 52 are formed in interposer 24, and one or more corresponding optical waveguides 56 are formed in optical chip 28. Each optical waveguide 52 (in interposer 24) should be aligned with high accuracy with the corresponding optical waveguide 56 (in optical chip 28).

When interposer 24 and optical chip 28 are soldered to substrate 32 using reflow, MCM 20 is subjected to high temperatures. In a typical reflow process the temperature may reach an order of 260° C., a temperature that is considerably higher than the temperatures that MCM 20 will likely experience during operation. Unless suitable measures are taken, as will be described below, the high temperature may cause significant deformation (warpage) in interposer 24. Since interposer 24 comprises a stack of layers (40, 44, 48) that differ from one another in Coefficient of Thermal Expansion (CTE), the interposer 24 will warp at high temperature rather than merely expand.

Insets 60 and 64 at the bottom of FIG. 1 illustrate two undesired effects caused by warpage of interposer 24. Inset 60 illustrates the deformation of interposer 24 relative to substrate 32. As seen, the deformation is more severe at the center of the interposer. At the center, the warpage may cause cold joints or even entirely break the interconnections between solder bumps 36 and the corresponding pads on substrate 32.

Inset 64 shows another effect-Misalignment between optical waveguides 52 (in interposer 24) and the corresponding optical waveguides 56 (in optical chip 28). Inset 64 shows a cross sectional view through the plane that connects the side faces of interposer 24 and optical chip 28. Optical chip 28 exhibits little or no warpage at high temperature. Interposer 24, on the other hand, suffers considerable deformation. As a result, one or more of optical waveguides 52 become misaligned with the corresponding optical waveguides 56. This effect, too, is more noticeable at the center of the interposer. Unless mitigated, such misalignment may attenuate the optical signals considerably. In a typical application, the required alignment accuracy is below 1 μm.

In alternative embodiments, optical chip 28 is attached to substrate 32 using epoxy, instead of using solder bumps 36. In an example embodiment, optical chip 28 is attached to substrate 32 after silicon interposer (or other die) 24 is attached and reflowed to substrate 32. In another embodiment, optical chip 28 is attached to interposer 24, and then the combination of optical chip 28 and interposer 24 is soldered to substrate 32 using reflow.

The description that follows provides example techniques for reducing the warpage of interposer 24 during reflow. These techniques overcome the two above-described effects of warpage, as well as other possible effects.

In some embodiments, solder bumps 36 (which connect interposer 24 and substrate 32) differ in size. The sizes of solder bumps 36 is set so that, on average, the solder bumps in a central portion of interposer 24 are larger than the solder bumps in a peripheral portion of the interposer. This technique is effective in reducing warpage since, as seen in the embodiment depicted in inset 60 of FIG. 1, warpage is more significant at the center of the interposer. Therefore, it is desirable to use a larger quantity of soldering material at the center.

In the present example depicted in insets 60 and 64, the warpage is more severe at the center of interposer 24. In alternative embodiments, however, the material compositions of the various layers of interposer 28 may be such that the warpage is more severe at the periphery of the interposer. In such embodiments, the sizes of solder bumps 36 is set so that, on average, the solder bumps in the central portion of interposer 24 are smaller than the solder bumps in a peripheral portion of the interposer. Generally speaking, the sizes of solder bumps 36 is set so that, on average, the solder bumps in the central portion of interposer 24 are different from the solder bumps in a peripheral portion of the interposer, the difference being dependent on the characteristics of the warpage.

Figures 2A, 2B:
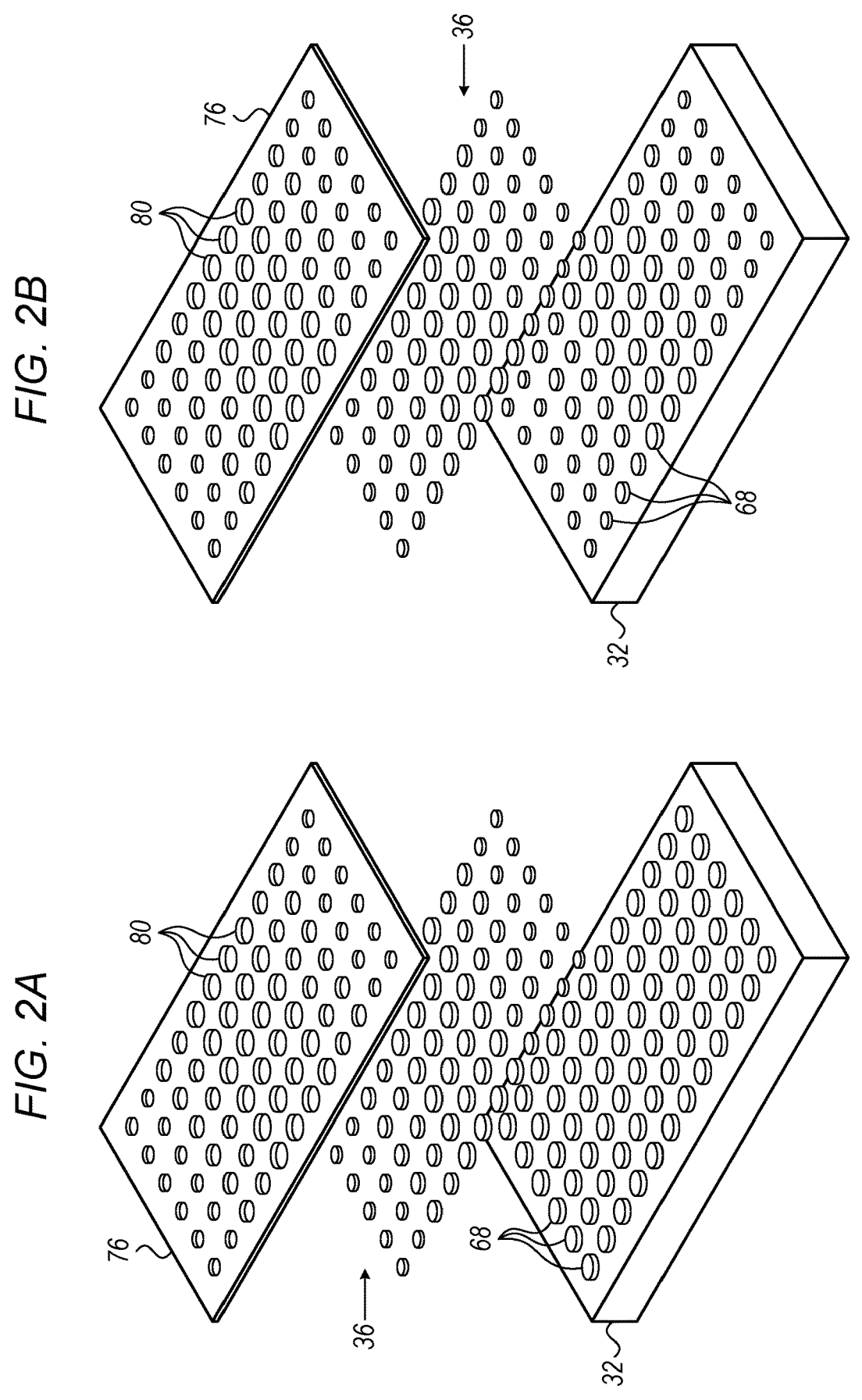

FIG. 2A is a diagram that schematically illustrates formation of non-uniformly sized spots of material for warpage-resilient soldering of solder interposer 24 to organic substrate 32, in accordance with an embodiment that is described herein. In this embodiment, soldering material is passed via a stencil 76 having openings 80, to form solder bumps 36. Solder bumps 36 are deposited onto respective conductive pads 68 on the surface of substrate 32.

As seen in the figure, openings 80 of stencil 76 are arranged in an array of non-uniformly sized openings. The average size (e.g., diameter) of openings 80 at the central portion of the array is larger than the average size of openings 80 at the periphery of the array. By using this stencil, solder bumps 36 (spots of soldering material) are deposited in an array of non-uniformly sized bumps. The average size (e.g., diameter) of solder bumps 36 at the central portion of the array is larger than the average size of solder bumps 36 at the periphery of the array. Put in another way, the size of the bumps may change (according to a suitable linear or non-linear function) as a function of distance from a center point of the interposer.

In the embodiment of FIG. 2A, the sizes of pads 68 are uniform across the array, even though the corresponding solder bumps vary in size.

FIG. 2B is a diagram that schematically illustrates formation of non-uniformly sized spots of solder material for warpage-resilient soldering of interposer 24 to organic substrate 32, in accordance with another embodiment that is described herein. The configuration of FIG. 2B differs from that of FIG. 2A in that the sizes (e.g., diameters) of pads 68 on substrate 32 are non-uniform. As seen, the average size (e.g., diameter) of pads 68 at the central portion of the array is larger than the average size of pads 68 at the periphery of the array.

In an example embodiment (referring to either FIG. 2A or 2B), the array of solder bumps 36 comprises sixty by forty Solder bumps. The diameter of the bumps at the edges of the array is 100 μm, and the diameter increases gradually toward a maximal diameter of 200 μm at the center of the array. In alternative embodiments, the diameter of solder bumps 36 does not vary gradually across the array. Instead, the array is divided into two or more discrete regions. Bumps 36 within each region are of uniform diameter. Regions closer to the center of the array have larger solder bumps, and vice versa. In these embodiments, too, the minimal solder-bump diameter (at the array edges) is on the order of 60 μm, and the maximal solder-bump diameter (at the center of the array) is on the order of 100 μm.

In an example embodiment (referring to FIG. 2B), the diameter of pads 68 at the edges of the array is 55 μm, and the diameter increases gradually toward a maximal diameter of 90 μm at the center of the array. Here, too, instead of varying the pad size gradually, the array of pads 68 may comprise discrete regions, with the pads 68 in each region being of the same size.

All the numerical values above are chosen solely by way of example. Any other suitable sizes can be used in alternative embodiments.

In the examples of FIGS. 2A and 2B, the terms "center of the array", "central portion of the array", "periphery of the array" and "peripheral portion of the array" are defined one-dimensionally, along one axis of the array. In other words, the size of solder bumps 36 (and openings 80) varies as a function of position along one axis, and is constant as a function of the other axis. In alternative embodiments, these terms can be defined two-dimensionally, i.e., with respect to both axes of the array. In these embodiments, the size of solder bumps 36 (and openings 80) varies as a function of position along both axes.

FIG. 3 is a flow chart that schematically illustrates a method for warpage-resilient soldering using non-uniformly sized spots of solder material, in accordance with an embodiment that is described herein. The method begins at a solder-bump formation operation 84, in which an array of non-uniformly sized solder bumps 36 is formed on substrate 32. At a soldering operation 88, interposer 24 is placed over the array of solder bumps 36, and the interposer is soldered to the substrate using reflow.

In alternative embodiments, described in detail below, warpage of interposer 24 is reduced by placing a rigid stiffener over the interposer while the MCM undergoes reflow soldering.

Figure 4:
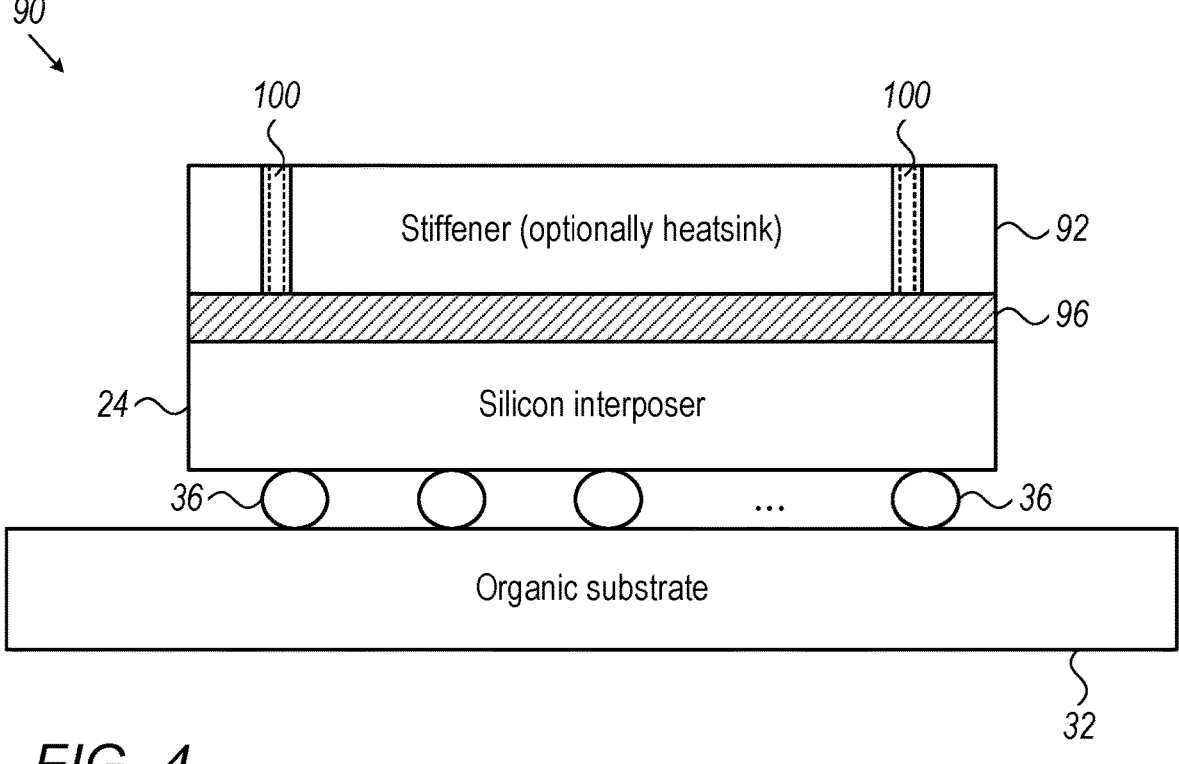
FIG. 4 is a schematic cross section of a MCM undergoing mass reflow soldering in the presence of a stiffener, in accordance with an embodiment that is described herein.

FIG. 4 is a schematic cross section of a MCM 90 undergoing reflow soldering in the presence of a stiffener, in accordance with an embodiment that is described herein. MCM 90 comprises a silicon interposer 24 soldered to an organic substrate 32 using solder bumps 36. In addition, a stiffener 92 is bonded to interposer 24 using a layer of bonding material 96. Stiffener 92 remains bonded to interposer 24 while MCM 90 undergoes the reflow soldering process. The rigidity of stiffener 92 prevents interposer 24 from deforming during reflow.

In some embodiments, stiffener 92 is removed from interposer 24 following the reflow process. In these embodiments, stiffener 92 may comprise any suitable type of rigid material, e.g., metal or glass.

In other embodiments, stiffener 92 remains attached to interposer 24 following reflow, as part of the finished MCM product. In these embodiments stiffener 92 is used (in addition to preventing warpage) as a heatsink that removes heat from interposer 24 (or from MCM 90 in general). In some embodiments, when stiffener 92 is also used as a heatsink, one or more thermal vias 100 are formed through the stiffener to improve heat conduction.

The process demonstrated in FIG. 4, including bonding and later removing stiffener 92, can be performed at wafer level, i.e., performed on a wafer that comprises a plurality of MCMs, before dicing the wafer into individual devices.

Figure 5:
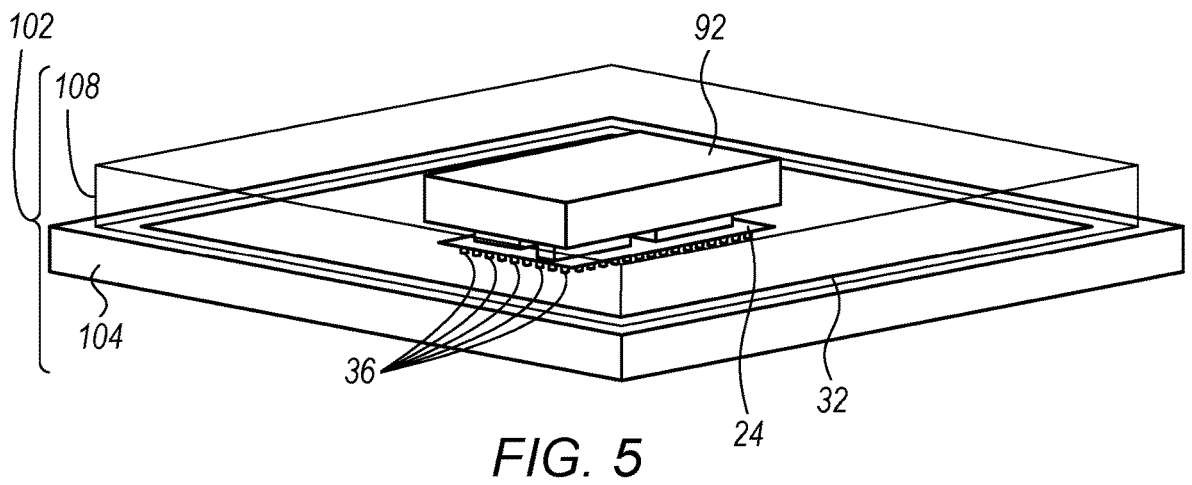
FIG. 5 is a schematic three-dimensional illustration of a MCM undergoing mass reflow soldering in the presence of a stiffener held by a mechanical fixture, in accordance with an embodiment that is described herein.

FIG. 5 is a schematic three-dimensional illustration of a MCM undergoing reflow soldering in the presence of a stiffener 92, in accordance with an embodiment that is described herein. In this example, instead of bonding stiffener 92 to interposer 24, stiffener 92 is held in place during the reflow process by a suitable mechanical fixture 102. Fixture 102 comprises a base 104 and a cover 108 placed on the base. Cover 108 comprises a suitable opening or recess that holds stiffener 92 over interposer 24 during the reflow process.

In this embodiment, there is no need for bonding material, and removal of the stiffener following the reflow process is simplified.

In some embodiments, the scheme of FIG. 5 can be implemented using conventional equipment used in reflow processes. For example, stiffener 92 and cover 108 can be placed on the MCM using a conventional "pick and place" machine used for placing electronic devices.

Figure 6:
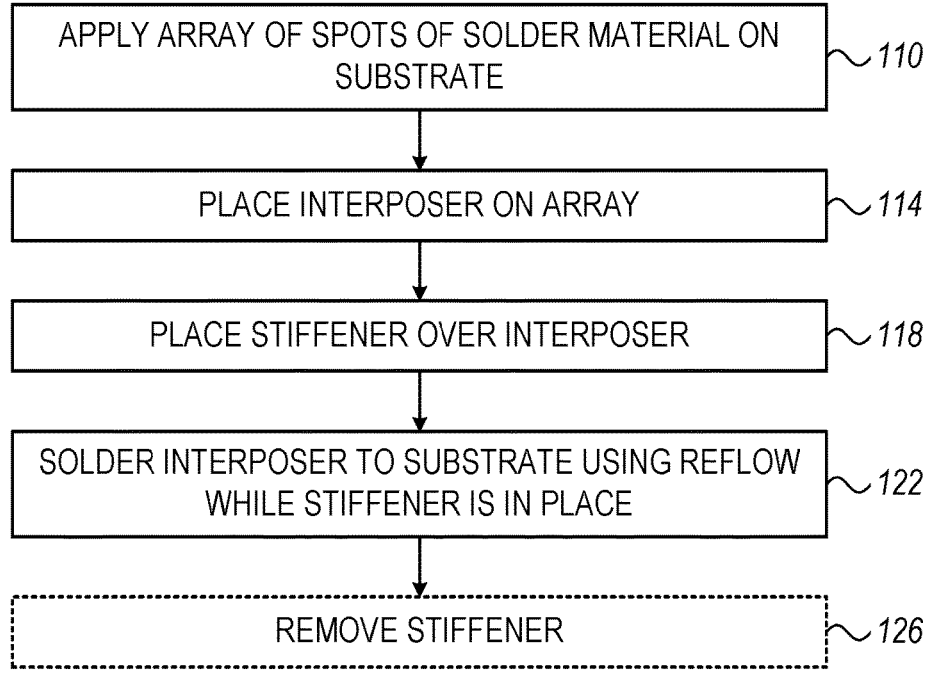
FIG. 6 is a flow chart that schematically illustrates a method for warpage-resilient soldering using a stiffener, in accordance with an embodiment that is described herein.

FIG. 6 is a flow chart that schematically illustrates a method for warpage-resilient soldering using a stiffener, in accordance with an embodiment that is described herein. The method begins at a solder-bump formation operation 110, in which solder bumps 36 are formed on substrate 24. At an interposer placement operation 114, interposer 24 is placed over solder bumps 36.

At a stiffener placement operation 118, stiffener 92 is placed over interposer 24. In various embodiments, stiffener 92 may be placed over interposer 24 in various ways, e.g., using bonding material 96 (see FIG. 4) or using mechanical fixture 102 (see FIG. 5).

At a soldering operation 122, interposer 24 is soldered to substrate 32 using reflow. Stiffener 92 remains placed on interposer 24 during the reflow process. If applicable (e.g., unless stiffener 92 is also used as a heatsink), stiffener 92 is removed from interposer 24 after completion of the reflow process.

The example MCM configurations and the example processes described above and depicted in FIGS. 1, 2A, 2B and 3-6 are chosen solely by way of example. In alternative embodiments, any other suitable configurations and/or processes can be used.

Although the embodiments described herein mainly address warpage-resilient attachment of dies to substrates in mass reflow soldering, the methods and systems described herein can also be used in other applications, such as in chip-to-chip assembly, wafer-to-wafer assembly and 3.0D heterogeneous integration.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions the present specification should be considered.

The invention claimed is:

1. A method for fabricating electronic devices, the method comprising:
applying an array of non-uniformly sized spots of solder material on a substrate, wherein an average size of the spots is larger in a center portion of the array than in a peripheral portion of the array; and
soldering a die to the substrate using the array.

2. The method according to claim 1, wherein soldering the die comprises soldering an interposer.

3. The method according to claim 1, wherein applying the array comprises disposing the solder material on the substrate via a stencil having an array of non-uniformly sized openings, an average size of the openings being larger in a center portion of the stencil than in a peripheral portion of the stencil.

4. The method according to claim 1, wherein applying the array comprises disposing the spots onto corresponding pads on the substrate, an average size of the pads facing the center portion of the array being larger than an average size of the pads facing the peripheral portion of the array.

5. The method according to claim 1, wherein applying the array comprises disposing the spots onto corresponding pads on the substrate, an average size of the pads facing the center portion of the array being equal to an average size of the pads facing the peripheral portion of the array.

6. The method according to claim 1, wherein soldering the die to the substrate comprises soldering the die using a reflow soldering process.

7. The method according to claim 6, wherein soldering the die to the substrate comprises placing a stiffener over the die, and performing the reflow soldering process while the stiffener is in contact with the die.

8. The method according to claim 7, wherein placing the stiffener over the die comprises bonding the stiffener to the die using a bonding material.

9. The method according to claim 7, wherein placing the stiffener over the die comprises temporarily fixing the stiffener over the die using a mechanical fixture.

10. The method according to claim 7, further comprising removing the stiffener from the die following the reflow process.

11. The method according to claim 7, further comprising retaining the stiffener on the die following the reflow process, for use as a heatsink.

12. A method for fabricating electronic devices, the method comprising:
applying an array of spots of solder material on a substrate;
placing a die over the array of spots;
placing a stiffener over the die; and
soldering the die to the substrate using the array of spots, by a reflow soldering process, while the stiffener is in contact with the die.

13. The method according to claim 12, wherein placing the stiffener over the die comprises bonding the stiffener to the die using a bonding material.

14. The method according to claim 12, wherein placing the stiffener over the die comprises temporarily fixing the stiffener over the die using a mechanical fixture.

15. An electronic device, comprising:
a substrate having an array of non-uniformly sized spots of solder material applied thereon, wherein an average size of the spots is larger in a center portion of the array than in a peripheral portion of the array; and
a die, which is soldered to the substrate using the array.

16. The electronic device according to claim 15, wherein the die comprises an interposer.

17. The electronic device according to claim 15, wherein the spots are disposed on corresponding pads on the substrate, an average size of the pads facing the center portion of the array being larger than an average size of the pads facing the peripheral portion of the array.

18. The electronic device according to claim 15, wherein the spots are disposed on corresponding pads on the substrate, an average size of the pads facing the center portion of the array being equal to an average size of the pads facing the peripheral portion of the array.

19. The electronic device according to claim 15, further comprising a stiffener placed over the die.

* * * * *